US006332744B1

(12) United States Patent
Fukushima et al.

(10) Patent No.: US 6,332,744 B1
(45) Date of Patent: Dec. 25, 2001

(54) AUTOMATIC WAREHOUSE AND TRANSFER SYSTEM USING THE SAME

(75) Inventors: Masazumi Fukushima, Aichi; Masatomi Kawaguchi, Kagamihara, both of (JP)

(73) Assignee: Murata Kakai Kabushiki Kaisha, Kyoto (JP)

( * ) Notice: Subject to any disclaimer, the term of this patent is extended or adjusted under 35 U.S.C. 154(b) by 0 days.

(21) Appl. No.: 09/546,180

(22) Filed: Apr. 10, 2000

(30) Foreign Application Priority Data

Jul. 26, 1999 (JP) .............................................. 11-210301

(51) Int. Cl.[7] ............................ B65G 1/00; B65G 65/00
(52) U.S. Cl. ........................................ 414/283; 414/940
(58) Field of Search .................................. 414/288, 940, 414/283

(56) References Cited

U.S. PATENT DOCUMENTS 5,048,164 * 9/1991 Harima ........................... 29/25.01 X
5,525,106 * 6/1996 Iizuka et al. ..................... 414/187 X
5,749,693 * 5/1998 Hanaya ................................ 414/277
5,788,447 * 8/1998 Yonemitsu et al. .............. 414/217 X

FOREIGN PATENT DOCUMENTS 10-98094 4/1998 (JP) .
11-191582 7/1999 (JP) .

* cited by examiner

*Primary Examiner*—Christopher P. Ellis
*Assistant Examiner*—Kenneth W Bower
(74) *Attorney, Agent, or Firm*—Armstrong, Westerman, Hattori, McLeland & Naughton, LLP

(57) ABSTRACT

A mast 18 of an automatic warehouse 10 is extended to a position under a floor 2 in a clean room in such a manner as to penetrate the floor 2, and a turn table 16 is installed under the floor. In addition, two types of stations, that is, a floor station 26 and an underfloor station 30 are provided, and shelves 14 are provided only in a floor space. The floor station 26 is connected to an unmanned carrier 34, while the underfloor station 30 is connected to a tracked cart 36. This automatic warehouse is easy to install and allows an underfloor space to be used to transfer articles.

3 Claims, 3 Drawing Sheets

20
4
14
14
14
38
12
32
10
24
14
14
6
26
22
32
II
II
34
14
2
3
3
3
37
3
28
36
32
18
8
30
16

AUTOMATIC WAREHOUSE AND TRANSFER SYSTEM USING THE SAME

FIELD OF THE INVENTION

The present invention relates to an automatic warehouse for a clean room and a transfer system using this automatic warehouse.

BACKGROUND OF THE INVENTION

In a clean room, an automatic warehouse is used to store unfinished products, and unmanned carriers or tracked carts connect the automatic warehouse and a processing device or the like. Such unmanned carriers or tracked carts, however, require a relatively large running space, so that available running paths and transfer capability are limited. Consequently, the transfer capability available between the automatic warehouse and the processing device or the like is likely to be insufficient.

SUMMARY OF THE INVENTION

It is an object of the present invention to enable a space under a floor or a space above a ceiling to be used for transferring articles and to enable a loading station of an automatic warehouse to be easily installed under the floor or above the ceiling.

The present invention provides an automatic warehouse comprising shelves, a mast, and elevating loading means for loading an article on a shelf by elevating and lowering along the mast, which are all provided in a floor space in a clean room, characterized in that the automatic warehouse has an extension section obtained by extending the mast through at least one of an underfloor space and a space above a ceiling in the clean room, and an article-loading station provided at a position corresponding to the extension section of the mast to load an article on the elevating loading weans.

The present invention is also characterized in that the shelves are arranged only in the floor space in the clean room in a generally cylindrical form.

In addition, the present invention is a transfer system characterized by comprising an automatic warehouse including shelves arranged only in a floor space in a clean room, elevating loading means for loading an article on the shelf by elevating and lowering along a mast, an extension section obtained by extending the mast through a space under a floor or a space above a ceiling in the clean room, and an article-loading station provided at a position corresponding to the extension section of the mast to load an article on the elevating loading means, and also comprising transfer means provided in the space under the floor or the space above the ceiling to transfer an article to the loading station.

According to the present invention, the mast is extended to a position under the floor or above the ceiling, where the loading station is provided, so that the station can be provided under the floor or above the ceiling with almost no working of beams of the floor or ceiling compared to an automatic warehouse entirely penetrating through the floor or ceiling. Thus, the loading station can be easily connected to the transfer means provided in the space under the floor or in the space above the ceiling.

If the shelves are arranged in a generally cylindrical form so that the elevating loading means can elevate and lower within this circle, no running section or rail needs to be provided in the automatic warehouse, thereby simplifying the elevation or lowering of the elevating loading means to the space under the floor or the space above the ceiling along the extension section. In addition, providing the shelves only in the floor space enables the mast to be easily extended through the space under the floor or the space above the ceiling, thereby eliminating the need to work beams of the floor or ceiling.

By providing transfer means, preferably tracked transfer means in the space under the floor or the space above the ceiling, article bypass transfer paths are obtained for transfer under the floor or above the ceiling in addition to floor transfer.

DETAILED DESCRIPTION OF THE PREFERRED EMBODIMENTS

Figure 1:
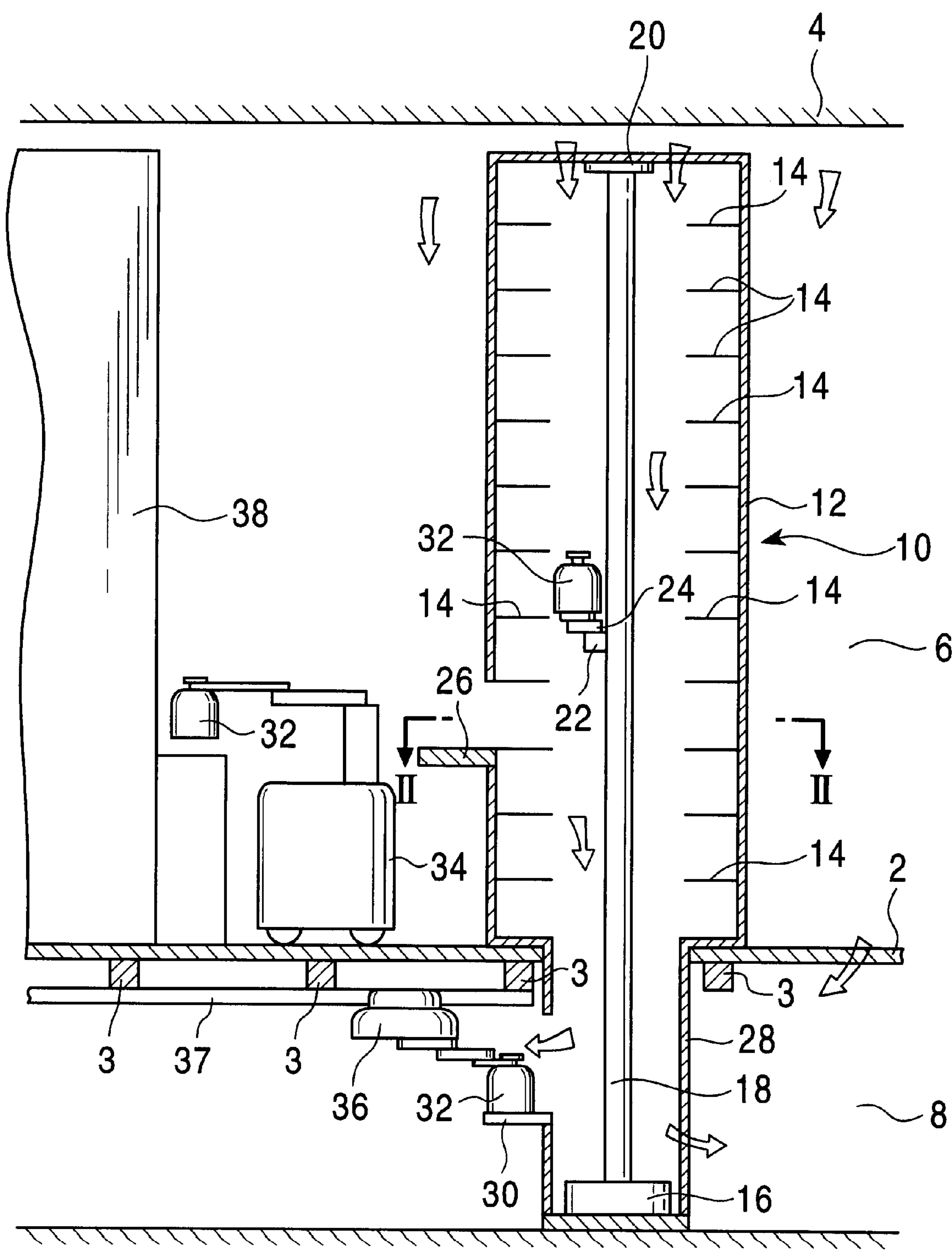
FIG. 1 is an end view of a transfer system according to an embodiment of the present invention.
Figure 2:
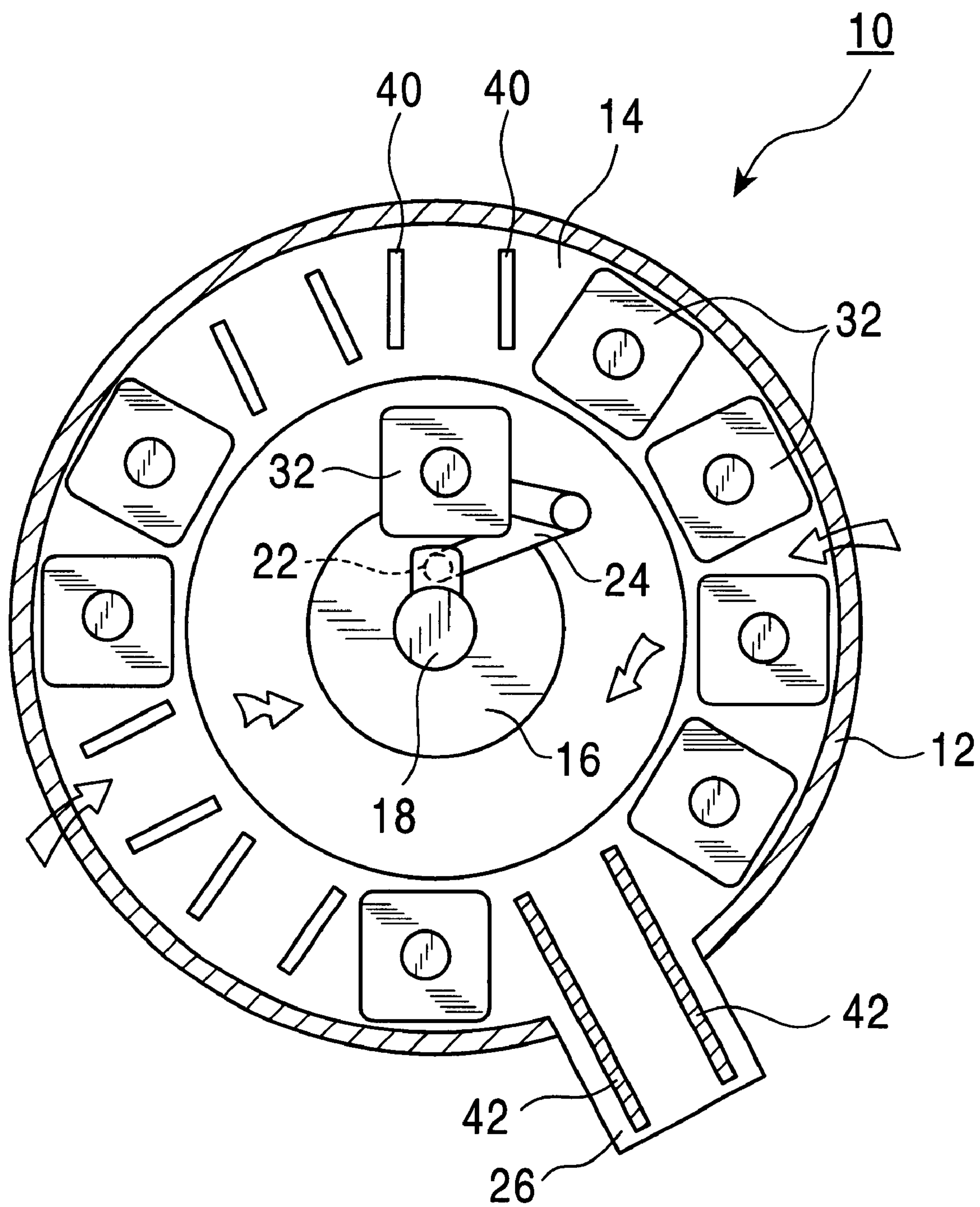
FIG. 2 is a sectional view taken along line II—II in FIG. 1.
Figure 3:
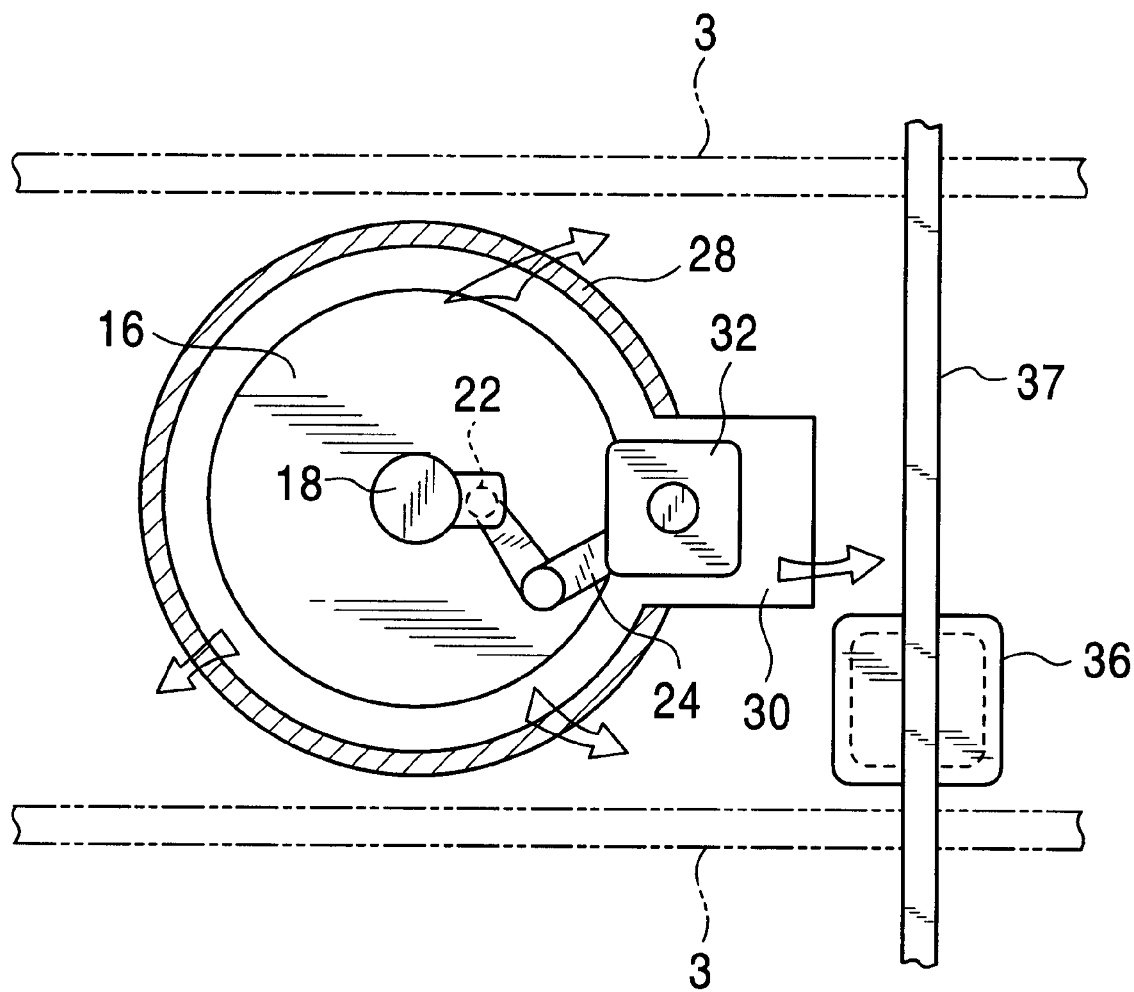
FIG. 3 is a sectional view of an underfloor section of an automatic warehouse.

FIGS. 1 to 3 show an embodiment. FIG. 1 shows the overall construction of a transfer system, 2 is a grated floor in a clean room and 3 is beams fixed to columns (not shown in the drawings) at appropriate intervals to support the floor 2. 4 is a ceiling on which a filter fan unit (not shown in the drawings) is provided to allow clean air to flow downward to a floor space 6. Clean air from the ceiling 4 passes through the grating in the floor 2 and then flows into an underfloor space 8, where it is reprocessed and cycled, for example, to a space above the ceiling 4.

10 is an automatic warehouse, 12 is a gas-permeative floor cover, 14 is a generally cylindrical shelf comprising individual shelves arranged in a plurality of layers in a generally circular form, 16 is a turn table provided in the underfloor space 8, and 18 is a mast. The mast 18 extends from the turn table 16 to a top portion of the automatic warehouse 10 and is rotatably supported by a support section 20. 22 is a platform capable of elevating and lowering between the floor space 6 and the underfloor space 8 along the mast 18 and comprising a loading scalar arm 24. 26 is a floor station, 28 is a gas-permeative underfloor cover, and 30 is an underfloor station. 32 is an article housed in a cassette so that dust will not enter the inside of the cassette even when it is transferred via a space above the ceiling 4 or the underfloor space 8. The scalar arm 24 may be replaced with a slide fork.

34 is an unmanned carrier running through the floor space 6 and which may be arbitrary transfer means on which the article 32 can be loaded from the floor station 26. 36 is a hanging tracked cart running through the underfloor space 8 that is a dead space and which may be an arbitrary cart that can run to the underfloor station 30, where it can be loaded with the article. This cart is not limited to a tracked cart but may be an unmanned carrier. Since, however, the underfloor space 8 has a small height, the tracked cart 36 is particularly preferable. The tracked cart 36 particularly preferably runs along a running rail 37 hanging from a ceiling. This is because the underfloor space 8 does not have a flat surface and because piping or the like may be installed under the floor. 38 is a processing device for semiconductors or liquid-crystal substrates which processes articles transferred by the unmanned carrier 34.

FIG. 2 shows a sectional view of the automatic warehouse 10 through the floor space 6. The individual shelves 14 are arranged in a generally circular form. 40 is a table on which the article 32 is placed. The scalar arm 24 is stretched from and contracted to the platform 22 elevating and lowering along the central mast 18 to load the article 32. The scalar arm 24 may be replaced with a slide fork or the like. In addition, the platform 22 must only be located in an empty space in the center of the generally circular shelf 14, and the mast 18 may be located in a notch formed in the cylinder comprised of the individual shelves 14 or outside the cylinder. The floor station 26 has a pair of chain conveyors 42, 42 for facilitating loading of the article on the unmanned carrier 34.

FIG. 3 shows the location of the automatic warehouse 10 in the underfloor space 8, the installation area of the automatic warehouse 10 in the underfloor section is determined by the turn table 16, the underfloor station 30, and a space sufficient to allow the article to be loaded on the underfloor station 30 by stretching and contracting the scalar arm 24. The platform 22 does not need to be rotatively moved in the underfloor section, and no rotative-movement space need to be provided for the platform 22. Thus, according to this embodiment, the cross section of the underfloor section can be reduced to allow the automatic warehouse 10 to penetrate through the floor 2 without interfering with the beams 3, 3. Consequently, the automatic warehouse 10 can be easily installed in the clean room, for example, by only removing a floor plate, thereby eliminating the need to move the beams. Although FIG. 3 shows that the platform 22 can be rotated through 360 degrees even in the underfloor section, this is not necessary and all the required area is one in which the turn table 16 and the underfloor station 30 can be installed and one in which the scalar arm 24 can load the article on the underfloor station 30. By setting the cross section of the automatic warehouse 10 in the underfloor space 8, within the gap between the beams 3, 3, the layout of the transfer system can be changed without the need to move the beams 3, 3. The tracked cart 36 may run not only through the underfloor space 8 but also through the space above the ceiling 4 using a running rail installed therein, and the automatic warehouse 10 may be extended through both the underfloor space 8 and the space above the ceiling 4, where a loading station may be provided.

Operation of the embodiment will be shown.

The mast 18 is rotated by the turn table 16, and the turn table 16 and the support section 20 support opposite ends of the mast 18 to prevent it from being toppled. By rotating the mast 18, elevating and lowering the platform 22 along the mast 18, and stretching and contracting the scalar arm 24, the article can be loaded on an arbitrary shelf from the stations 26, 30. Since the shelves 14 are provided only in the floor space 6, the automatic warehouse 10 has such a small cross section in the underfloor space 8 as to penetrate through the gap between the beams 3, 3 for easy installation.

Clean air from the ceiling 4 flows as shown by the arrow in the figure, for example, it enters the automatic warehouse 10 through a top portion or side surface of the floor cover 12, then flows downward through an empty space around the mast 18, and is finally emitted to the inside of the underfloor space 8 through the underfloor cover 28 or the underfloor station 30. This construction ensures the flow of clean air to the shelf 14 and the underfloor station 30 to prevent the article 32 from being contaminated.

The automatic warehouse 10 has two types of stations, the floor station 26 and the underfloor station 30, which are connected to the unmanned carrier 34 the tracked cart 36, respectively, thereby allowing two types of article transfer routes to be provided. Thus, for example, the unmanned carrier 34 for floor running is used for short-distance transfer between the processing device and the automatic warehouse 10, while the tracked cart 36 is used, for example, for long-distance interprocess transfer between a preprocess and a postprocess. Then, the short-distance transfer and the interprocess transfer can be distinguished from each other to improve the transfer capability, whereby the automatic warehouse 10 can be used as a buffer that corresponds to both types of transfers. Although the embodiment has shown the example in which the mast 18 is extended through the underfloor space 8, similar effects obtained by extending it through the space above the ceiling 4, where the underfloor station 30 and the running rail 37 are installed. In this case, the table 16 is installed on the floor.

What is claimed is:

1. An automatic warehouse comprising shelves, a mast, and elevating loading means for loading an article on a shelf by elevating and lowering along the mast, which are all provided in a floor space in a clean room, characterized in that the automatic warehouse has an extension section obtained by extending the mast through at least one of a space under a floor and a space above a ceiling in the clean room, and an article-loading station provided at a position corresponding to the extension section of the mast to load an article on said elevating loading means.

2. An warehouse as in claim 1, characterized in that said shelves are arranged only in the floor space in the clean room in a generally cylindrical form.

3. A transfer system characterized by comprising:

an automatic warehouse including shelves arranged only in a floor space in a clean room, elevating loading means for loading an article on said shelf by elevating and lowering along a mast, an extension section obtained by extending the mast through a space under a floor or a space above a ceiling in the clean room, and an article-loading station provided at a position corresponding to the extension section of the mast to load an article on said elevating loading means, and transfer means provided in the space under the floor or the space above the ceiling to transfer an article to said loading station.

* * * * *